(12) United States Patent
Tojo

(10) Patent No.: US 9,142,803 B2
(45) Date of Patent: Sep. 22, 2015

(54) ORGANIC EL DISPLAY DEVICE

(71) Applicant: Japan Display Inc., Tokyo (JP)

(72) Inventor: Toshio Tojo, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/146,783

(22) Filed: Jan. 3, 2014

(65) Prior Publication Data

US 2014/0191215 A1     Jul. 10, 2014

(30) Foreign Application Priority Data

Jan. 4, 2013    (JP) ................................. 2013-000032

(51) Int. Cl.
     *H01L 51/52*      (2006.01)
     *H01L 27/32*      (2006.01)

(52) U.S. Cl.
     CPC .......... *H01L 51/5284* (2013.01); *H01L 27/322* (2013.01)

(58) Field of Classification Search
None
See application file for complete search history.

(56) References Cited

U.S. PATENT DOCUMENTS

| | | | | |
|---|---|---|---|---|
| 8,748,875 | B2 * | 6/2014 | Koresawa et al. | ............... 257/40 |
| 2008/0203898 | A1 * | 8/2008 | Kobayashi | .................... 313/498 |
| 2009/0066259 | A1 * | 3/2009 | Hwang et al. | ............... 315/169.3 |
| 2012/0025699 | A1 * | 2/2012 | Okumoto et al. | ............. 313/506 |
| 2012/0099312 | A1 | 4/2012 | Yoshioka et al. | |
| 2012/0168787 | A1 * | 7/2012 | Okumoto et al. | ............... 257/89 |

FOREIGN PATENT DOCUMENTS

| | | |
|---|---|---|
| JP | 3-254048 | 11/1991 |
| KR | 20100075746 A | 7/2010 |
| KR | 20120024945 A | 3/2012 |

OTHER PUBLICATIONS

Office Action issued by Korean Patent Office on Jan. 20, 2015 regarding a counterpart Korean patent application No. 10-2014-0000110.
Office Action dated Jul. 28, 2015 regarding a corresponding Korean Patent Application No. 10-2014-0000110.

* cited by examiner

*Primary Examiner* — Joseph Schoenholtz

(74) *Attorney, Agent, or Firm* — Lowe Hauptman & Ham, LLP

(57) ABSTRACT

An organic EL display device ensures brightness and improves a contrast ratio by a reduction in external light reflection. The organic EL display device includes a wavelength selective absorption filter that absorbs a light in a given absorption spectrum uniform in a display region. An absorption spectrum has a negative correlation with an outgoing spectrum in which respective spectrums of R pixels, G pixels, and B pixels are synthesized together.

10 Claims, 4 Drawing Sheets

ORGANIC EL DISPLAY DEVICE

CROSS-REFERENCE TO RELATED APPLICATION

The present application claims priority from Japanese application JP2013-000032 filed on Jan. 4, 2013, the content of which is hereby incorporated by reference into this application.

BACKGROUND OF THE INVENTION

1. Field of the Invention

The present invention relates to an organic EL display device, and more particularly to a technique for reducing an external light reflection to improve a contrast ratio.

2. Description of the Related Arts

An external light reflection on a display surface of a display device such as an organic EL display device reduces a contrast ratio of an image. As one of measures against this problem, there is a structure in which a circularly polarizing plate is arranged on a display surface. As another of the measures, there is a structure in which a neutral density (ND) filter that evenly absorbs a visible light wavelength range is arranged on the display surface.

SUMMARY OF THE INVENTION

A rated white brightness of the display device is denoted by Bw, and a reflection brightness on the display surface is denoted by Br. The reflection brightness Br corresponds to the degree of degradation of black level in an image, and is defined by designating an external light brightness. Also, the white brightness and the reflection brightness when the circularly polarizing plate is not arranged are denoted by Bw0 and Br0 respectively.

When the circularly polarizing plate is arranged on the display surface, the external light is half-absorbed by the circularly polarizing plate at the time of incidence, and the remaining half of the external light is reflected on the display surface, and absorbed by the circularly polarizing plate when again passing through the circularly polarizing plate. That is, if an influence of scattering or the like is ignored, the reflection brightness Br becomes 0. However, the circularly polarizing plate also absorbs half of light emission from the display device. That is, the white brightness Bw is ($\frac{1}{2}$)·Bw0 which is half of that when the circularly polarizing plate is not arranged, resulting in such a problem that the brightness reduction becomes large. In this example, in the organic EL display device, if an electric power to be supplied to an organic light-emitting diode (OLED) configuring each pixel is increased, the brightness can be increased. However, one of features of the organic EL display device is that the organic EL display device can display a bright image with lower power consumption than a liquid crystal display device requiring a backlight, and increasing a supply power to increase the brightness diminishes the above feature. Also, there arises such a problem that the deterioration of a light emitting layer is accelerated with an increase in the supply power.

On the other hand, when an ND filter is arranged on the display surface, the white brightness Bw and the reflection brightness Br can be adjusted according to a transmittance t of the ND filter, and become Bw=t·Bw0, and Br=$t^2$·Br0. That is, if the transmittance t is set to 50 to 100%, the brightness Bw can be increased as compared with the provision of the circularly polarizing plate. However, the reflection brightness Br is more increased as the transmittance t is larger. For example, when the transmittance t is set to 50%, and the white brightness Bw is set to the same value ($\frac{1}{2}$)·Bw0 as that in the case of the circularly polarizing plate, the reflection brightness Br becomes ($\frac{1}{4}$)·Br0, and becomes larger than that when the circularly polarizing plate is provided. That is, although the white brightness Bw can be increased more than that when the circularly polarizing plate is provided, there arises such a problem that the reflection brightness Br is also increased to decrease contrast.

The present invention aims at providing an organic EL display device that reduces the external light reflection to improve a contrast ratio while suppressing a reduction in the brightness to a relatively small degree.

(1) According to the present invention, there is provided an organic EL display device in which pixels of plural colors are arranged in a display region, each of the pixels having a light emitting unit of organic electroluminescence and emitting light from the light emitting unit, the light having a spectrum and a wavelength band which correspond to one of the plural colors, the wavelength band being different from a wavelength band corresponding to another of the plural colors, the organic EL display device including: an absorption filter that absorbs a light in a given absorption spectrum uniform in the display region, in which the absorption spectrum has a negative correlation with an outgoing spectrum obtained by synthesizing spectrums which are different from each other, and each of the spectrums corresponds to each of the plural colors.

(2) In the organic EL display device according to the item 1, the each of the spectrums has a peak wavelength at which each of the spectrums is a maximum intensity, the peak wavelength corresponding to the each of the plural colors, the absorption spectrum has one or more spectral peaks, one of the spectral peaks is in correspondence with a spectral valley of the spectrum of the light emitting units, and a position of the one of the spectral peaks is between two of the peak wavelengths which correspond to two of the plural colors and are adjacent each other.

(3) In the organic EL display device according to the item 2, the spectral valley is included in the outgoing spectrum obtained by the synthesizing spectrums.

(4) In the organic EL display device according to the above item (2), the spectral peaks causes a reduction in transmittance of light, and a peak of the reduction corresponds to the spectral valley.

(5) In the organic EL display device according to the above item (2), the two of the plural colors are blue and green.

(6) The organic EL display device according to the above item (1) further includes: an anti-reflective film stuck on a surface of the display region through an adhesive layer, in which the absorption filter consists of the adhesive layer containing pigments that absorb the light therein.

(7) The organic EL display device according to the above item (1) further includes: a sealing film stacked above the light emitting unit, and sealing the light emitting unit, in which the sealing film is formed of a silicon nitride film and absorbs a shorter wavelength band than a wavelength band which is absorbed by the absorption filter.

(8) The organic EL display device according to the above item (7), the wavelength band which is absorbed by the absorption filter includes a peak wavelength of blue.

(9) The organic EL display device according to the above item (1) further includes: a sealing film stacked on a light emission layer that generates organic electroluminescence, which is disposed in the light emitting unit, and sealing the light emission layer, in which the sealing film is formed of a silicon nitride film and absorbs a shorter wavelength band than a wavelength band which is absorbed by the absorption filter.

(10) The organic EL display device according to the above item (9), the wavelength band which is absorbed by the absorption filter includes a peak wavelength of blue.

DETAILED DESCRIPTION OF THE INVENTION

An organic EL display device according to an embodiment of the present invention will be described with reference to the accompanying drawings.

Figure 1:
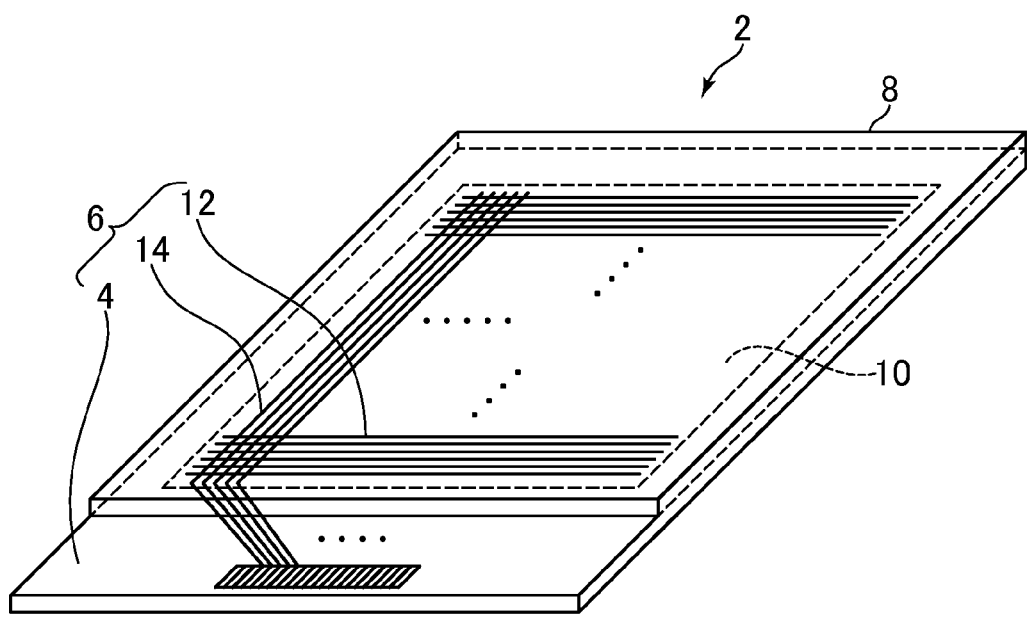
FIG. 1 is a schematic perspective view illustrating an organic EL display device according to an embodiment of the present invention.

FIG. 1 is a schematic perspective view illustrating an organic EL display device 2 according to an embodiment of the present invention. The organic EL display device 2 according to this embodiment includes a TFT substrate 6 in which a plurality of thin film transistors is arranged on a glass substrate 4 in a matrix, and a sealing substrate 8 bonded on the TFT substrate 6. Also, a plurality of pixels to be subjected to a display control is arranged in a display area 10 of the organic EL display device 2, and the organic EL display device 2 displays a color image in the display area 10 on the sealing substrate 8 side. In the organic EL display device 2, red (R) pixels, green (G) pixels, and blue (B) pixels are arranged in a striped manner in the display area 10. That is, pixels having the same color are aligned in a vertical direction of the image, and R, G, and B pixels are cyclically arranged in the horizontal direction. Also, a large number of scanning signal lines 12 is laid on the TFT substrate 6 at regular intervals, and a large number of video signal lines 14 are laid at regular intervals in a direction perpendicular to a direction along the scanning signal lines are laid. A thin film transistor (TFT) used for switching, and an OLED are formed in each of pixel areas sectioned by the scanning signal lines 12 and the video signal lines 14. The OLED includes an anode electrode (anode), a cathode electrode (cathode), and an organic layer interposed between those electrodes. The organic layer interposed between the anode electrode and the cathode electrode includes a light emitting layer as well as a hole injection layer, a hole transport layer, an electron transport layer, and an electron injection layer. A signal from the video signal line 14 is supplied to the anode electrode through the TFT, and light emission of the light emitting layer is controlled by a potential difference generated between the anode electrode and the cathode electrode.

Figure 2:
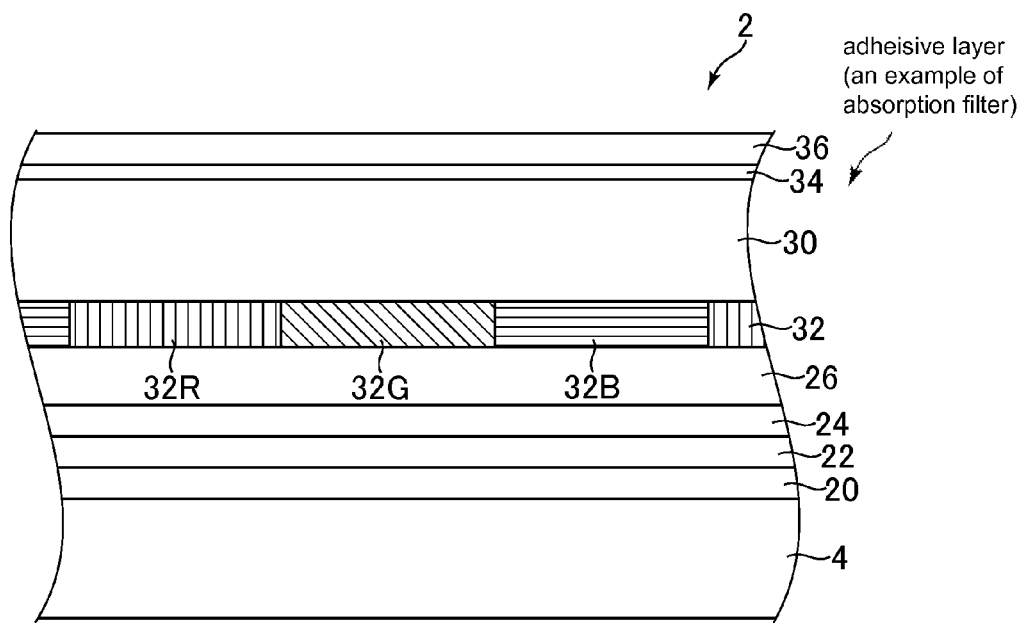
FIG. 2 is a schematic partial cross-sectional view taken along a horizontal direction of a display area of the organic EL display device.

FIG. 2 is a schematic partial cross-sectional view taken along a horizontal direction of the display area 10 of the organic EL display device 2. The organic EL display device 2 is of a top emission type, and extracts a light generated in the OLED in a direction opposite to the glass substrate 4 on which the TFTs and the OLEDs are formed. That is, the light of the OLEDs is emitted upward in FIG. 2. The organic EL display device 2 illustrated in FIG. 2 adopts a color filter method as a colorization method. That is, a white light is generated by the OLED, and the white color is allowed to pass through a color filter to obtain the respective colors of RGB.

An OLED layer 22 having a laminated structure configuring the above-mentioned OLEDs is formed on a layer 20 on which the TFTs, scanning signal lines, and video signal lines are formed, above the glass substrate 4. Then, a sealing film 24 is stacked on the OLED layer 22. The sealing film 24 has a moistureproof function of preventing the OLED from moisture contained in a resin layer 26 for filling in response to a fact that a characteristic of the OLED is deteriorated by moisture. In this embodiment, the sealing film 24 is made of silicon nitride (SiN), and formed by CVD.

The sealing substrate 8 includes a glass substrate 30, a color filter 32 stacked on one surface of the glass substrate 30, and an anti-reflective (AR) film 36 stuck onto the other surface of the glass substrate 30 with an adhesive (adhesive layer 34). The AR film 36 has, for example, a structure in which an anti-reflective layer and a base film are stacked on each other. In the AR film 36, a thickness of the anti-reflective layer is designed so that a light input from the anti-reflective layer side, and reflected by an interface between the anti-reflective layer and the base film becomes identical in amplitude with and opposite in phase to a light reflected by a surface of the anti-reflective layer, and those two lights are canceled by each other by interference to suppress the reflection.

The TFT substrate 6 and the sealing substrate 8 are stuck on each other so that the sealing film 24 and the color filter 32 face each other through the filling resin layer 26. A space between the TFT substrate 6 and the sealing substrate 8 is filled with the filling resin layer 26 to form a solid sealing structure. The resin layer 26 is made of a fluent and curable material, and stacked, for example, on the sealing substrate 8 by printing or dispenser in a fluent state. After the TFT substrate 6 and the sealing substrate 8 have been stuck on each other, the filling resin layer 26 is cured by heat and so on.

Figure 3:
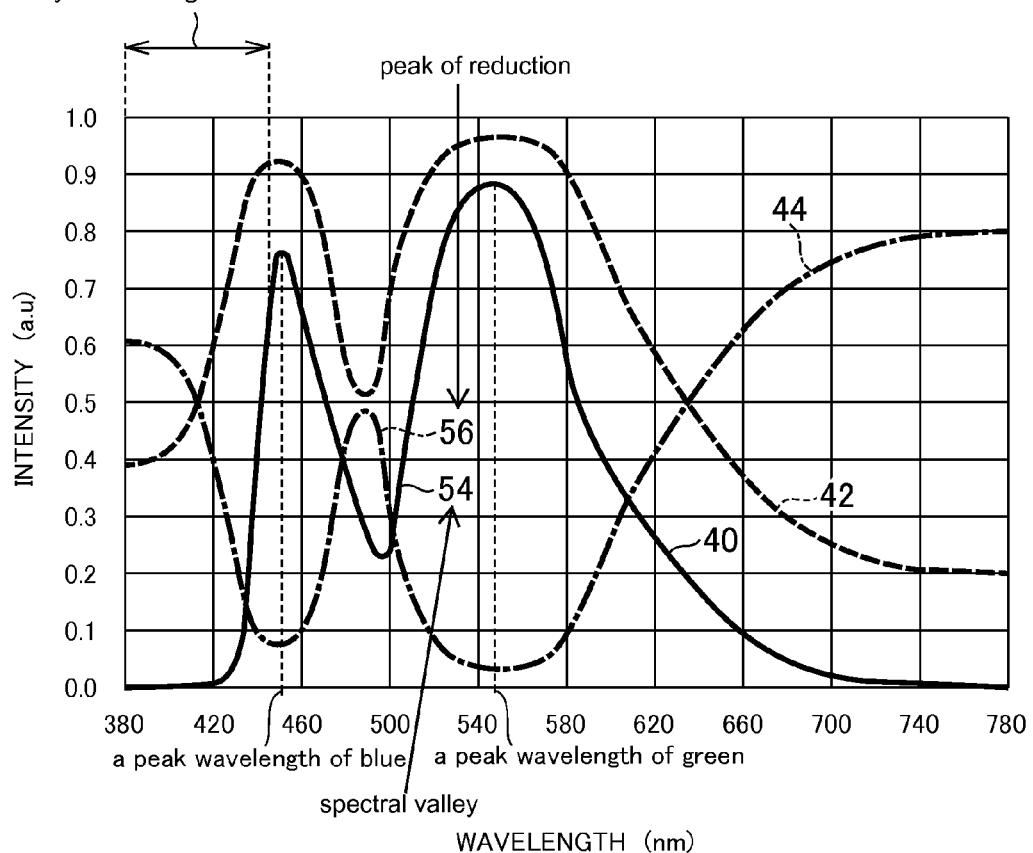
FIG. 3 is a graph illustrating an example of a light emitting spectrum of an OLED in the organic EL display device.

The OLED that is a light emitting portion of the organic EL display device 2 mixes the respective lights caused by organic electroluminescence of blue and the other colors together to generate a white light. Specifically, the light emitting layer is formed of a laminated body including the light emitting layers of respective colors of R, G, and B. FIG. 3 is a graph illustrating an example of a light emitting spectrum of the OLED in the organic EL display device 2. Referring to FIG. 3, the axis of abscissa represents a wavelength, and the axis of ordinate represents a relative intensity, and a light emission spectrum 40 is represented by a solid curve. The light emission spectrum 40 has a peak corresponding to blue in the vicinity of a wavelength of 450 nanometers (nm), and has a peak corresponding to green around wavelengths 530 to 560 nm. The light emission spectrum 40 has a valley in which intensity thereof relatively largely drops, and becomes minimum in the vicinity of a wavelength 500 nm between those peaks. Generally, the feature of this spectrum is found in the OLED that obtains white light emission by mixture of blue with the other colors. Incidentally, FIG. 3 also illustrates a transmission spectrum 42 and an absorption spectrum 44 of a wavelength selective absorption filter which will be described later. The OLED that obtains white light emission by mixture of blue with the other colors can also be configured by a laminated body of a light emission layer of blue and a light emission layer of orange color.

The color filter 32 transmits a light of a component corresponding to a color of the pixel in the white light generated by the OLED. Specifically, as the color filter 32, color filters 32R that transmit a wavelength band of red are arranged in correspondence with R pixels, color filters 32G that transmit a wavelength band of green are arranged in correspondence with G pixels, and color filters 32B that transmit a wavelength band of blue are arranged in correspondence with B pixels.

The R pixels, the G pixels, and the B pixels emit lights in wavelength bands different from each other in correspondence with the colors of the respective pixels. Unless an influence of the wavelength selective absorption filter which will be described later is taken into account, the outgoing lights from the respective pixels of RGB have spectrums in which the light emission spectrum of the OLED is multiplied by a transmission characteristic of any one of the color filters 32R, 32G, and 32B which corresponds to the pixel in question. In this example, a wavelength having a maximum intensity in the spectrum of the outgoing lights of the respective pixels is called color specific peak wavelength.

Figure 4:
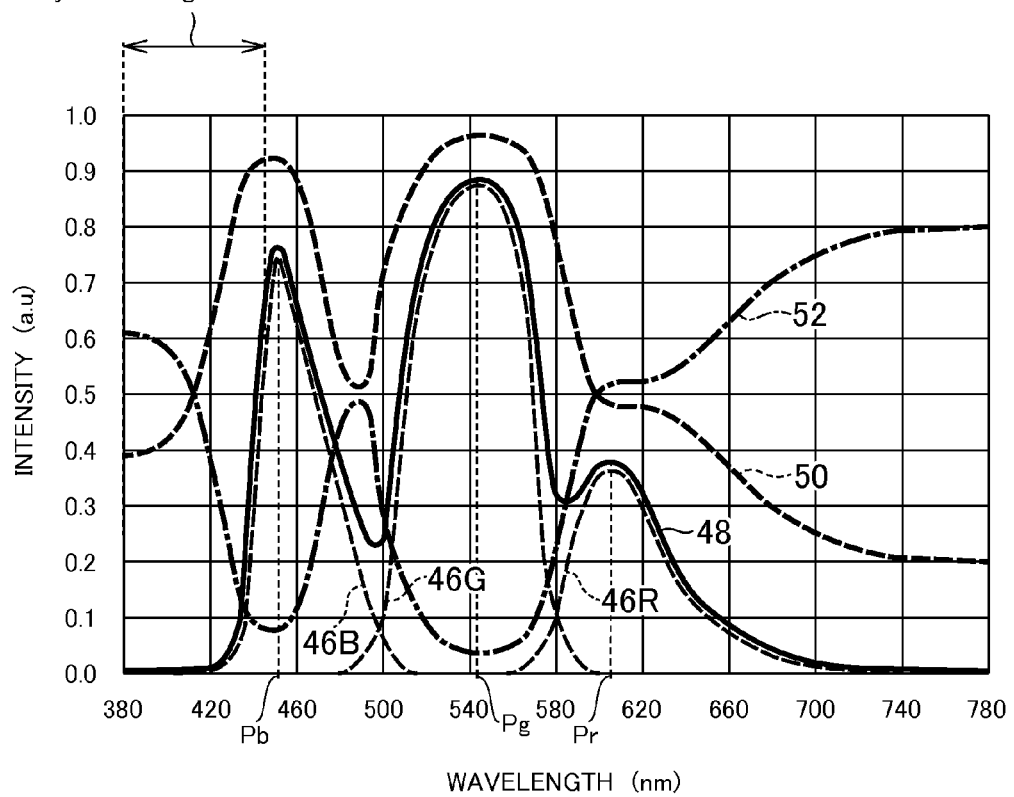
FIG. 4 is a graph illustrating spectrums of respective outgoing lights from an R pixel, a G pixel, and a B pixel for a white light having an emission spectrum of FIG. 3, and an outgoing spectrum obtained by synthesizing those spectrums.

FIG. 4 is a graph illustrating spectrums 46R, 46G, and 46B of the respective outgoing lights from an R pixel, a G pixel, and a B pixel for the white light having an emission spectrum of FIG. 3, and an outgoing spectrum 48 obtained by synthesizing those spectrums for the respective colors of the pixels. Referring to FIG. 4, the axis of abscissa represents a wavelength, and the axis of ordinate represents a relative intensity, and Pr, Pg, and Pb indicated on the axis of abscissa represent the respective color specific peak wavelengths of the R pixels, the G pixels, and the B pixels. Incidentally, FIG. 4 also illustrates a transmission spectrum 50 and an absorption spectrum 52 of the wavelength selective absorption filter.

The organic EL display device 2 has a wavelength selective absorption filter on a layer upper than the OLED layer 22. The wavelength selective absorption filter is formed of an absorption filter that absorbs a light by a given absorption spectrum, uniform in the display region. The absorption spectrum is set to have a negative correlation with the outgoing spectrum. In this example, since an absorption factor $A(\lambda)$ and a transmittance $T(\lambda)$ in a wavelength $\lambda$ of the wavelength selective absorption filter has a relationship of $A(\lambda)+T(\lambda)=1$, the wavelength selective absorption filter is set so that transmission spectrum, that is, the spectrum of the light transmitted through the wavelength selective absorption filter has a positive correlation with the outgoing spectrum. As illustrated in FIG. 4, the transmission spectrum 50 has a positive correlation when the transmission spectrum 50 is shaped along the outgoing spectrum 48, and the absorption spectrum 52 has a negative correlation when a change in the intensity thereof has a tendency to be opposite to that of the outgoing spectrum 48.

The wavelength selective absorption filter absorbs the light of the wavelength region lower in the intensity of the outgoing light from the pixels or the light emitted from the OLED, more than the wavelength region higher in the intensity of the light. Therefore, a reduction in the brightness of the organic EL display device 2 is smaller than a filter that evenly absorbs a visible light wavelength region such as an ND filter. On the other hand, basically, an external light has a relatively high intensity even in a wavelength region lower in the intensity of the outgoing light from the pixels of the organic EL display device 2, or the light emitted from the OLED. Therefore, a ratio of a component absorbed while shuttling in and out of the wavelength selective absorption filter when being reflected by the organic EL display device 2, to the external light becomes larger than a ratio of a reduction in the light emission brightness of the organic EL display device 2 by the wavelength selective absorption filter. That is, with the provision of the wavelength selective absorption filter, the external light reflection can be reduced more than the reduction in the brightness, and the contrast can be improved.

Specifically, a pigment (colorant, dye, etc.) that absorbs the light is allowed to be contained in the adhesive layer 34 that sticks the AR film 36 to the glass substrate 30, and the adhesive layer 34 is allowed to function as the wavelength selective absorption filter. A known pigment can be used as the pigment that becomes a wavelength selective absorption material. The type of pigment is selected and the content thereof is adjusted according to a desired absorption spectrum. For example, as the pigment, there have been known anthraquinone red, disazo yellow, halogenated cyanine green, phthalocyanine green, phthalocyanine blue, and dioxazine violet. Also, the sealing film 24 made of SiN functions as an absorption filter for a band of a shorter wavelength than the color specific peak wavelength of blue.

The color filter 32 is also an absorption filter having a type of wavelength selectivity. However, in the present invention, since the wavelength selective absorption filter provided separately from the color filter 32 is homogeneous formed in the display region, the manufacture is easy, and the external light reflection can be further reduced by compensating the effect by the color filter 32.

The absorption spectrum of the wavelength selective absorption filter is set to have a negative correlation with the outgoing spectrum as described above. In this example, the outgoing light is based on the light from the OLED, and the intensity of the outgoing light is also basically reduced in the wavelength lower in the light emission intensity of OLED. That the absorption spectrum is set to be stronger in a portion where the intensity of the light emission spectrum is low is consistent with that the absorption spectrum is set to have the above negative correlation. The absorption spectrum 44 (or the transmission spectrum 42) illustrated in FIG. 3 is set to correspond to the light emission spectrum 40 from this viewpoint.

As the light emission spectrum 40 has a relatively deep valley 54 formed between blue and green, a mountain 56 of the absorption spectrum 44 can be set in correspondence with the valley 54. It is preferable that the mountain of the absorption spectrum is set that a reduction in the transmittance of the light caused by the mountain is commensurate with a reduction in the light emission spectrum in the valley, that is, a position and a shape of the mountain of the absorption spectrum are set to conform with a position and a shape of the valley of the light emission spectrum. For example, the position (valley wavelength) of the valley deep in the light emission is defined as a wavelength where the light emission spectrum is minimum within an interval between the color specific peak wavelengths of blue and green, and a position of the top of the absorption can be defined as a wavelength in which an absorption spectrum becomes maximum. Also, the shape can be defined by a feature quantity such as a height of the mountain, a depth of the valley, or half widths of the mountain and the valley. The height of the top can be defined by a difference in height from a foot thereof to a maximum value thereof, and the depth of the valley can be defined by a difference in height from an upper edge thereof to a minimum value thereof. Also, in the case of a complicated shape in which the mountain or the valley has a plurality of peaks, the complicated shape can be transformed into a shape of an independent mountain or valley by smoothing or approximation using a given function having a mountain-shaped or valley-shaped curve, and the mountain in the absorption spectrum may be set using the transformed mountain or valley.

The absorption spectrum can be set to have the above-mentioned absorption peak in at least one of intervals of the adjacent color specific peak wavelengths. For example, when the light emission spectrum 40 forms the valley between blue and green, and between green and red, it is preferable that the absorption peaks are provided in correspondence with both of the valleys. Also, the absorption peak may be provided in only one of the valleys. In the OLED, the valley between blue and green is generally larger than the valley between green and red, if the absorption peak is disposed in only one valley, the external light reflection can be basically more reduced when the absorption peak corresponding to the valley between blue and green is provided.

In this example, since the light emission spectrum of the OLED basically has a positive correlation with an outgoing spectrum of the pixels, it is preferable that the absorption spectrum set in correspondence with the light emission spectrum is set to have a negative correlation with the light emission spectrum (or the transmission spectrum is set to have a positive correlation with the light emission spectrum). Since it is preferable that the correlation is stronger, for example, as illustrated in an example of the absorption spectrum 44 or the transmission spectrum 42 corresponding to the light emission spectrum 40 in FIG. 3, the wavelength selective absorption filter is preferably configured to absorb not only the valleys between the color specific peak wavelengths, but also a component on a shorter wavelength side relative to the color specific peak wavelength of blue, and a component on a longer wavelength side relative to the color specific peak wavelength of red.

In this example, a BCP (brightness contrast performance) defined by the following expression can be used as an index for evaluating the brightness and the contrast.

$$BCP = \frac{\left(\frac{B_w}{B_r^{1/2}}\right)}{\left(\frac{B_w 0}{B_r 0^{1/2}}\right)} \quad \text{(Ex. 1)}$$

Since a contrast C is given by C=Bw/Br, BCP is a geometric mean of the white brightness Bw and the contrast C, and BCP is preferably higher. In the organic EL display device 2 according to the present invention, in principle, it is possible to reduce the external light reflection to 25% while suppressing the brightness reduction to 30% by using the wavelength selective absorption filter. In this case, BCP is 1.4. On the other hand, in a structure in which the ND filter is arranged which is the conventional art, BCP becomes 1. Therefore, according to the configuration using the wavelength selective absorption filter described above, there is obtained the organic EL display device that reduces the external light reflection and improves the contrast ratio while keeping a relatively low brightness reduction.

In the above-mentioned embodiment, a configuration in which the adhesive layer of the AR film 36 is formed as the wavelength selective absorption filter has been described. Alternatively, the function of the wavelength selective absorption filter can be provided in another layer of the organic EL display device 2. For example, pigments can be contained in the sealing film 24 or the filling resin layer 26, a layer which is a wavelength selective absorption filter can be additionally stacked between the glass substrate 30 and the color filter 32, or the glass substrate 30 can be mixed with pigments and colored.

The colorization method of the organic EL display device 2 according to the above-mentioned embodiment is of a color filter method as illustrated in FIG. 2. In this example, the present invention can be also applied to the organic EL display device 2 adopting another colorization method. For example, even in the organic EL display device 2 in which instead of the provision of the color filter 32, the OLED layer 22 of each of the R pixel, the G pixel and the B pixel has a light emission layer that generates organic electroluminescence of the color corresponding to the pixel, and the OLED per se conducts the light emission from the pixels of the respective colors of RGB, the wavelength selective absorption filter is provided as in the above-mentioned embodiment so that the external light reflection can be reduced to improve the contrast ratio while keeping a relatively low brightness reduction.

Also, the present invention can be also applied to a self-emitting display device other than the organic EL display device, for example, a plasma display device or a field emission display (FED).

As described above in the embodiment, according to the present invention, there is obtained the organic EL display device that reduces the external light reflection and improves the contrast ratio while keeping a relatively low brightness reduction.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device in which pixels of plural colors are arranged in a display region, each of the pixels having a light emitting unit of organic electroluminescence and emitting light from the light emitting unit, the light having a spectrum and a wavelength band which correspond to one of the plural colors, the wavelength band being different from a wavelength band corresponding to another of the plural colors, the organic EL display device comprising:
   an absorption filter that absorbs a light in a given absorption spectrum uniform in the display region,
   wherein the absorption spectrum has a negative correlation with an outgoing spectrum obtained by synthesizing spectrums which are different from each other, and
   each of the spectrums corresponds to each of the plural colors.

2. The organic EL display device according to claim 1, wherein the each of the spectrums has a peak wavelength at which each of the spectrums is a maximum intensity, the peak wavelength corresponding to the each of the plural colors,
   the absorption spectrum has one or more spectral peaks,
   one of the spectral peaks is in correspondence with a spectral valley of the spectrums of the light emitting units, and
   a position of the one of the spectral peaks is between two of the peak wavelengths which correspond to two of the plural colors and are adjacent each other.

3. The organic EL display device according to claim 2, wherein the spectral valley is included in the outgoing spectrum obtained by the synthesizing spectrums.

4. The organic EL display device according to claim 2, wherein the spectral peaks causes a reduction in transmittance of light, and
   a peak of the reduction corresponds to the spectral valley.

5. The organic EL display device according to claim 2, wherein the two of the plural colors are blue and green.

6. The organic EL display device according to claim 1, further comprising: an anti-reflective film stuck on a surface of the display region through an adhesive layer,
   wherein the absorption filter consists of the adhesive layer containing pigments that absorb the light therein.

7. The organic EL display device according to claim 1, further comprising: a sealing film stacked above the light emitting unit and sealing the light emitting unit,
    wherein the sealing film is formed of a silicon nitride film and absorbs a shorter wavelength band than a peak wavelength of the spectrum corresponding to a blue pixel.

8. The organic EL display device according to claim 7,
    wherein the wavelength band which is absorbed by the absorption filter includes a peak wavelength of blue.

9. The organic EL display device according to claim 1, further comprising: a sealing film stacked on a light emission layer that generates organic electroluminescence, which is disposed in the light emitting unit, and sealing the light emission layer,
    wherein the sealing film is formed of a silicon nitride film and absorbs a shorter wavelength band than a wavelength band which is absorbed by the absorption filter.

10. The organic EL display device according to claim 9,
    wherein the wavelength band which is absorbed by the absorption filter includes a peak wavelength of blue.

\* \* \* \* \*